United States Patent
Yang et al.

(10) Patent No.: US 8,847,284 B2
(45) Date of Patent: Sep. 30, 2014

(54) INTEGRATED CIRCUIT WITH STANDARD CELLS

(71) Applicant: Taiwan Semiconductor Manufacturing Company, Ltd., Hsin-Chu (TW)

(72) Inventors: Kuo-Nan Yang, Hsin-Chu (TW); Chou-Kun Lin, Hsin-Chu (TW); Jerry Chang-Jui Kao, Taipei (TW); Yi-Chuin Tsai, Sing-Yan Township (TW); Chien-Ju Chao, New Taipei (TW); Chung-Hsing Wang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/829,484

(22) Filed: Mar. 14, 2013

(65) Prior Publication Data

US 2014/0239410 A1  Aug. 28, 2014

Related U.S. Application Data

(60) Provisional application No. 61/770,231, filed on Feb. 27, 2013.

(51) Int. Cl.
*H01L 27/10* (2006.01)
*H01L 27/02* (2006.01)

(52) U.S. Cl.
CPC .................................. *H01L 27/0207* (2013.01)
USPC ......................................................... 257/207

(58) Field of Classification Search
CPC ..................... H01L 27/11807; H01L 27/0207; H01L 27/11803; H01L 23/528
USPC ................................................. 257/202–207
See application file for complete search history.

(56) References Cited

U.S. PATENT DOCUMENTS 6,885,059 B2 *  4/2005  Yamazaki et al. ............. 257/316
2003/0156460 A1 *  8/2003  Wu ........................... 365/185.33

* cited by examiner

*Primary Examiner* — Kevin M Picardat
*Assistant Examiner* — Paul Patton
(74) *Attorney, Agent, or Firm* — Slater & Matsil, L.L.P.

(57) ABSTRACT

A die includes a plurality of rows of standard cells. Each of all standard cells in the plurality of rows of standard cells includes a transistor and a source edge, wherein a source region of the transistor is adjacent to the source edge. No drain region of any transistor in the each of all standard cells is adjacent to the source region.

18 Claims, 10 Drawing Sheets

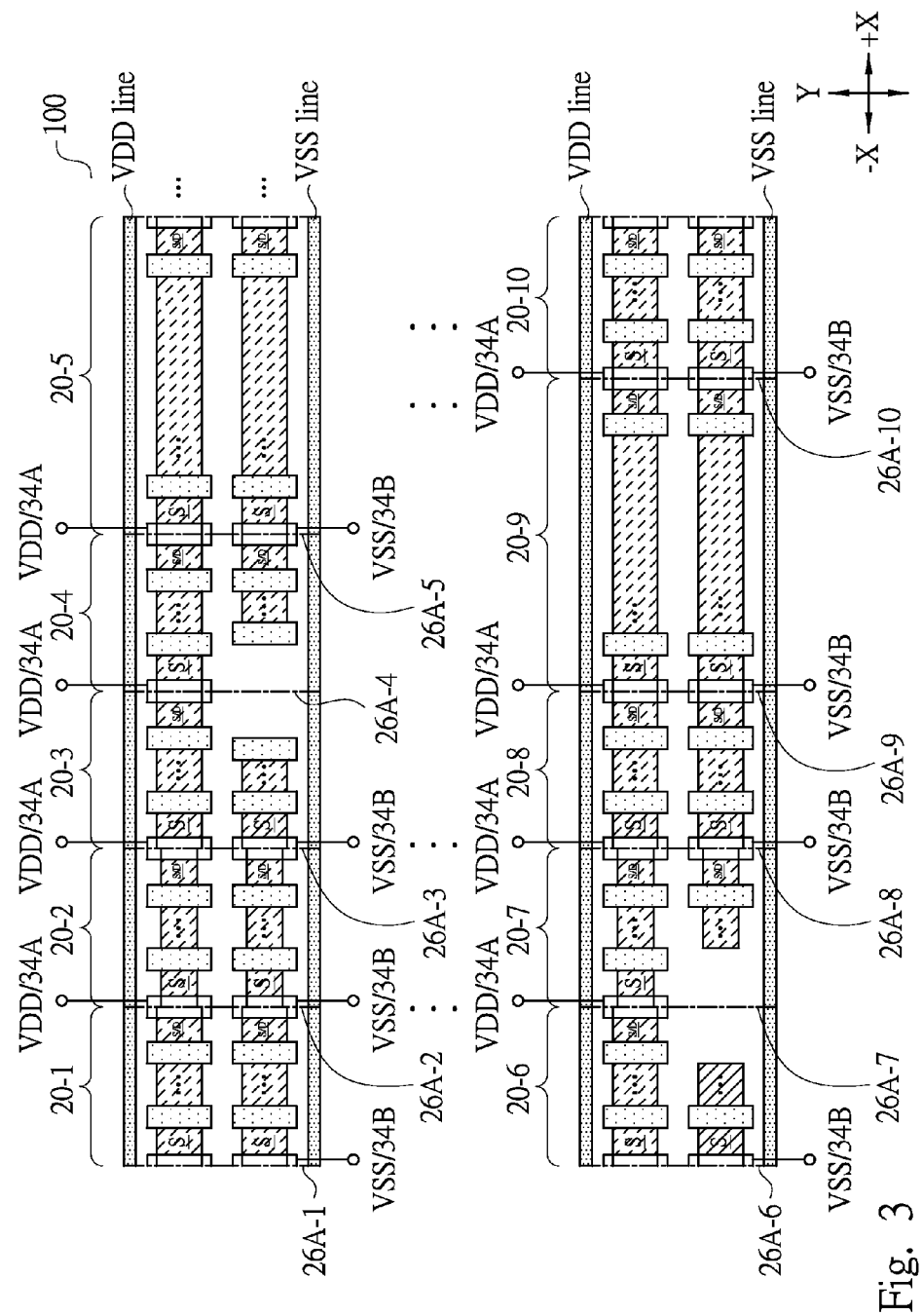

INTEGRATED CIRCUIT WITH STANDARD CELLS

This application claims priority to U.S. Provisional Application No. 61/770,231, filed on Feb. 27, 2013, and entitled "FinFET Device Structure and Methods of Making Same," which application is incorporated herein by reference.

BACKGROUND

In the art of integrated circuit design, to improve the reusability, standard cells are often laid out and saved in a circuit library. When an integrated circuit is designed, the standard cells are retrieved from the circuit library, and are placed and routed. The placement is performed using a computer, which runs a tool for designing integrated circuits. The standard cells are placed as a plurality of rows that are parallel to each other. The edges of some standard cells may be abutted. Other standard cells, however, cannot be abutted. In these cases, filler cells are inserted between the standard cells in order to separate the standard cells from each other. The introduction of the filler cells, however, results in the chip area to be wasted.

BRIEF DESCRIPTION OF THE DRAWINGS

For a more complete understanding of the embodiments, and the advantages thereof, reference is now made to the following descriptions taken in conjunction with the accompanying drawings, in which:

FIG. 3 illustrates a schematic layout of a die in accordance with exemplary embodiments, which die includes a plurality of standard cells, wherein source edges of the standard cells face the same direction;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A design scheme of standard cells and the respective integrated circuits formed using the standard cells are provided in accordance with various exemplary embodiments. The variations of the embodiments are discussed. Throughout the various views and illustrative embodiments, like reference numbers are used to designate like elements.

Figure 1:
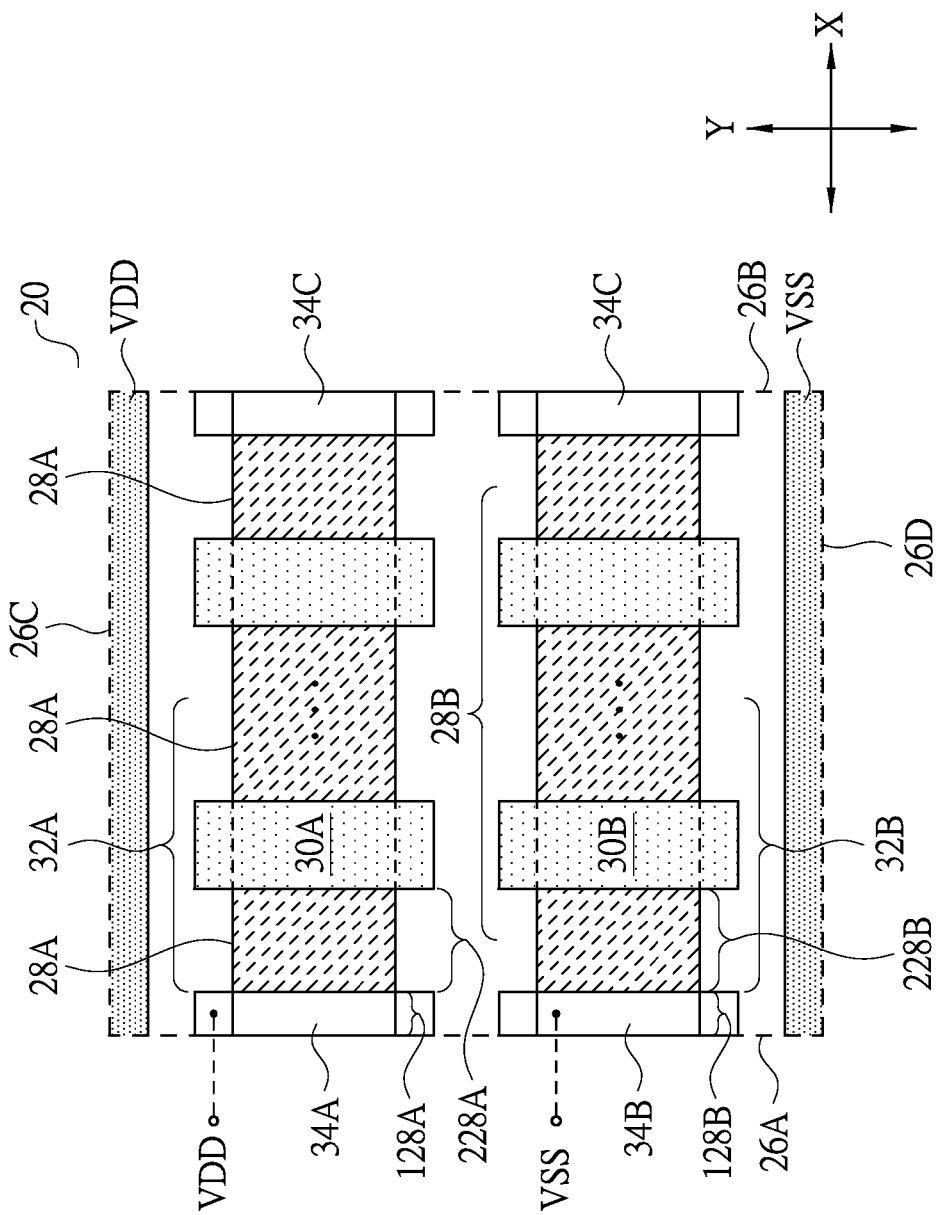
FIG. 1 illustrates a schematic layout of an exemplary standard cell in accordance with exemplary embodiments.
Figure 6:
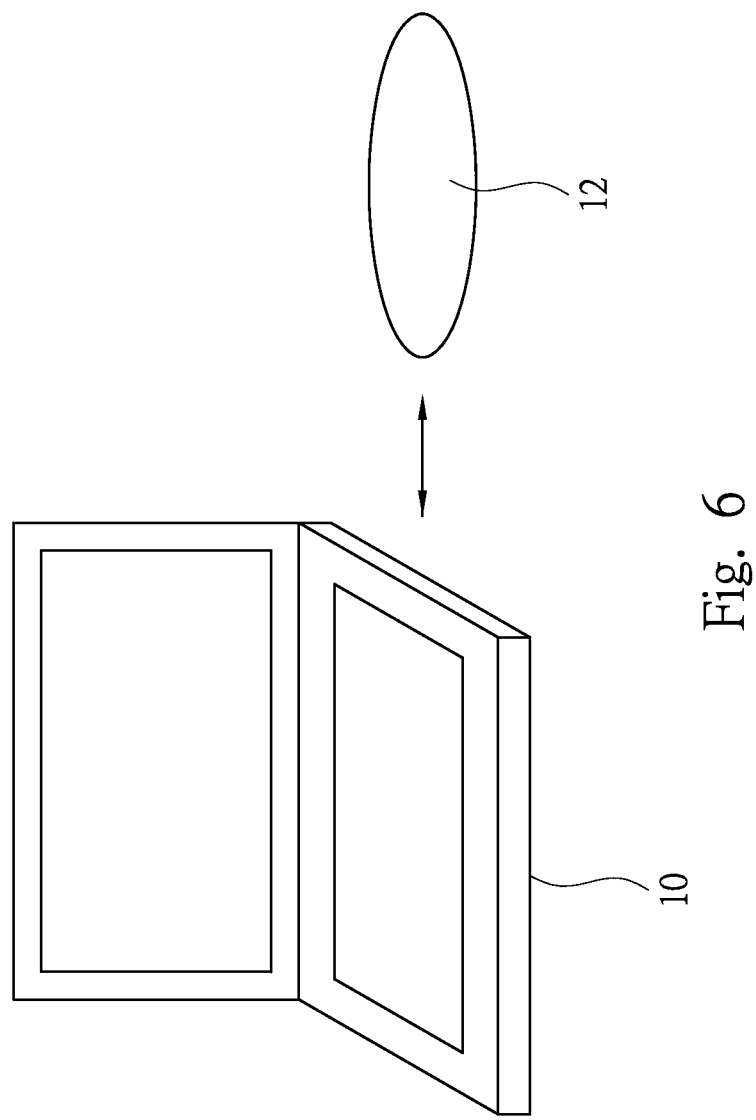
FIG. 6 schematically illustrates a storage medium for storing standard cells and a computer for accessing the stored standard cells.

FIG. 1 illustrates a schematic layout of standard cell 20. Throughout the description, the term "standard cell" refers to the pre-designed cells that have been laid out and stored in a circuit library, which may be in the form of a database. Furthermore, the standard cells are stored in a tangible storage medium 12 (FIG. 6) such as a hard drive. As shown in FIG. 6, computer 10 is electrically and signally coupled to storage medium 12 in order to layout integrated circuits. In the design of integrated circuits, the standard cells are retrieved from the circuit library, and are placed in a placement step. The placement step is performed using computer 10 (FIG. 3), which runs the software for designing integrated circuits. The software includes a circuit layout tool, which has the function of placement and routing.

Referring to FIG. 1, in accordance with some embodiments, standard cell 20 includes one or more transistors, which may be Fin Field-Effect Transistors (FinFETs), planar transistors, or the like. Standard cell 20 may be an inverter, a NOR gate, a NAND gate, a XOR gate, or any other standard cell. The transistor(s) in standard cell 20 may include a p-type transistor, an n-type transistors, or combinations thereof. In the following discussion, each of the illustrated standard cells 20 is illustrated as including one PMOS transistor 32A, and one NMOS transistor 32B. PMOS transistor 32A includes gate electrode 30A and source region 228A. NMOS transistor 32B includes gate electrode 30B and source region 228B. It is appreciated that a standard cell may include more transistors, and may have designs more complicated than what are illustrated.

As shown in FIG. 1, standard cell 20 includes edges 26A and 26B on opposite sides of standard cell 20. Edges 26A and 26B are parallel to the Y direction and perpendicular to the X direction. Standard cell 20 further includes edges 26C and 26D perpendicular to edges 26A and 26B. Throughout the description, the X direction is referred to as the row direction, wherein edges 26A and 26B may be abutted to other standard cells in the same row. Furthermore, power supply lines VDD and VSS may extend in the X direction, and have edges aligned to edges 26C and 26D, respectively.

In accordance with some embodiments, each of the standard cells in the circuit library includes at least one source edge, which is the edge that is adjacent to at least one, and possibly more, source regions of the transistors in standard cell 20. The respective side of the source edge is referred to as the source side of standard cell 20. Throughout the description, edge 26A is the source edge. The drain regions of the transistors in the standard cells are not allowed to be on the source side. For illustration purposes, the source regions of transistors are marked as "S," and the drain regions of the transistors are marked as "D." Furthermore, the notation "S/D" refers to a region that may be a source region or a drain region.

Standard cells 20 in accordance with the embodiments of the present disclosure, on the other hand, may include a source region(s), a drain region(s), or the combination of source region(s) and drain region(s) adjacent to edge 26B. Throughout the description, when edge 26B includes one drain region, the respective side is referred to as a drain side, and edge 26B is referred to as a drain edge, regardless of whether there is a source region(s) adjacent to edge 26B or not. In addition to at least one drain region, the drain side of standard cell 20 may, or may not, include one or more of source region(s), drain region(s), or the combination of source and drain regions. In the embodiments wherein the side of edge 26B includes source region(s) and no drain region, edge 26B is also a source edge, and the respective side is also a source side. In such a standard cell, there are two source edges on opposite sides of the respective cell, and there is no drain side, and no drain edge.

Figure 4:
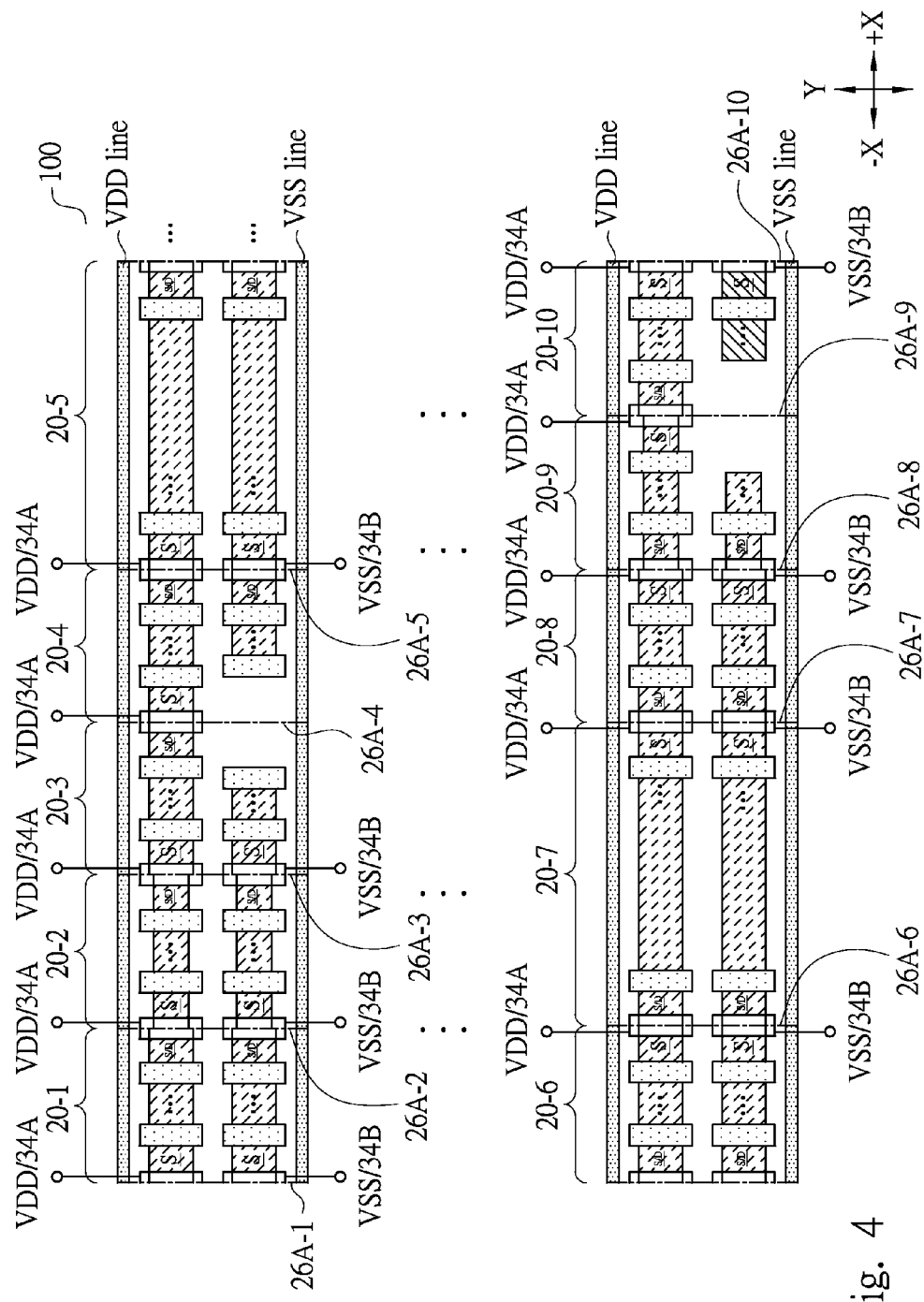
FIG. 4 illustrates a schematic layout of a die in accordance with exemplary embodiments, which die includes a plurality of standard cells, wherein source edges of the standard cells in a same row face the same direction, and source edges of the standard cells in another row face an opposite direction.
Figure 5:
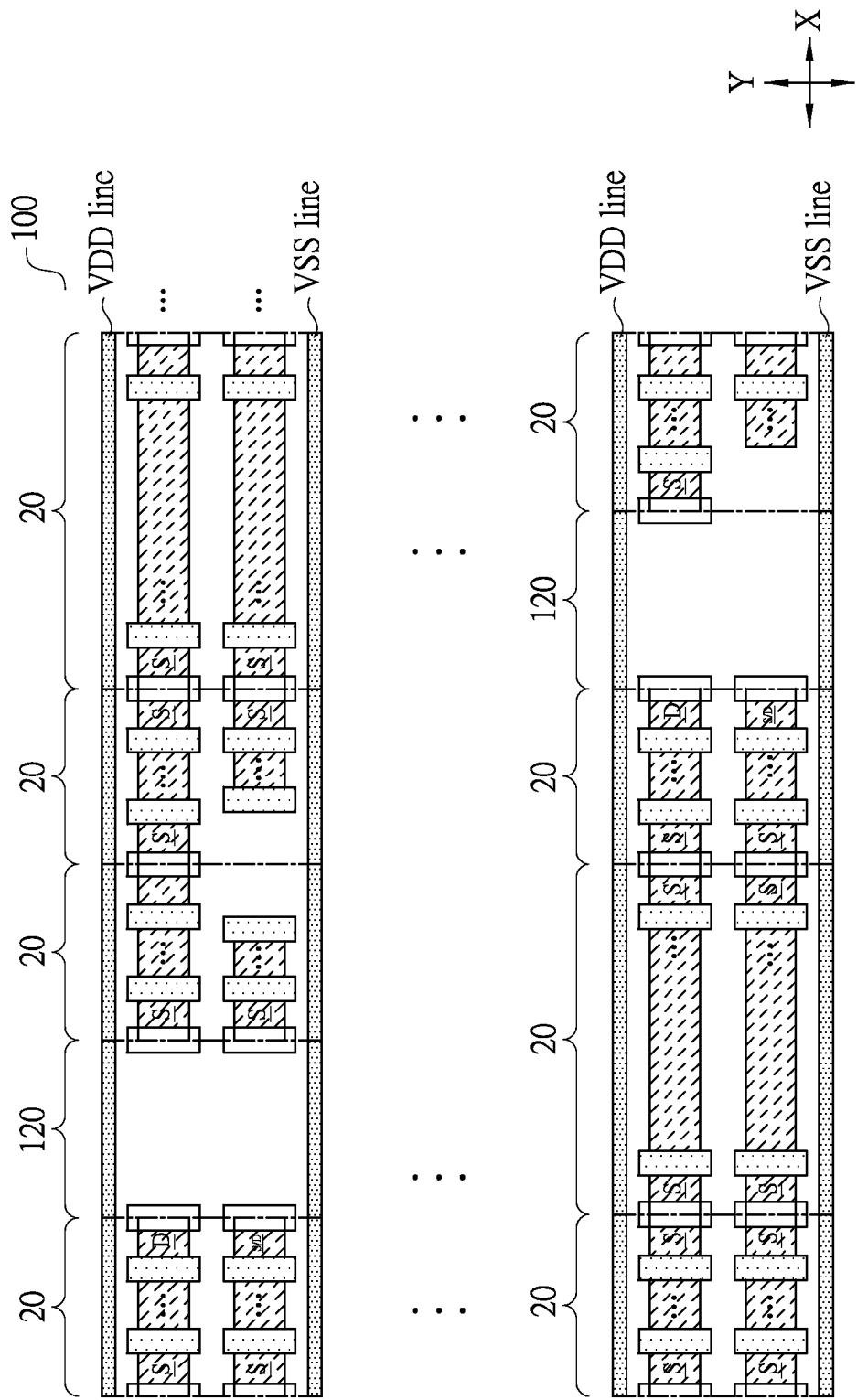
FIG. 5 illustrates a schematic layout of a die in accordance with exemplary embodiments, wherein source side Polys on OD Edge (PODEs) are not tied to power supply voltages VDD and VSS.

As shown in FIG. 1, in some embodiments, dummy gates 34 (including 34A, 34B, and 34C) are formed in standard cell 20. Throughout the description, dummy gates 34 are also referred to as Polys on OD Edges (PODEs) 34. PODEs 34 are such named since they may be formed of polysilicon, and may be formed simultaneously when the gate electrodes of the transistors in standard cell 20 are formed. PODEs 34 may also be used to cover the edges of the active regions such as active regions 28A and 28B in FIG. 1. Each of PODEs 34 may have an edge aligned to edge 26A or 26B. According, when another standard cell is abutted to edge 26A or 26B, the PODEs in the other standard cell will merge with the PODEs 34 at the respective edge, as shown in FIGS. 3 through 5. Alternatively stated, in the merged standard cells, each of the merged PODEs 34 extends into two abutted cells, with a half in each of the two abutted cells.

PODEs 34 include PODEs 34A, 34B, and 34C. PODE 34A is joined to edge 26A, which means that PODE 34 has an edge aligned to edge 26A of cell 20. In the illustrative embodiments, PODE 34A is joined to a source region 228A of PMOS transistor 32A, and is referred to as a source PODE hereinafter. PODE 34A may be tied to power supply voltage VDD, or may be electrically floating. PODE 34B is also joined to edge 26A, which means that PODE 34 has an edge aligned to edge 26A of cell 20. Furthermore, PODE 34B is joined to a source region 228B of NMOS transistor 32B, and is also referred to as a source PODE hereinafter. PODE 34B may be tied to power supply voltage VSS, or may be electrically floating. PODE 34C is joined to edge 26B, which means that PODE 34 has an edge aligned to edge 26B of cell 20. Furthermore, each of PODEs 34C may be joined to a source region or a drain region, wherein the source region or the drain region belongs to a PMOS transistor or an NMOS transistor. PODEs 34C may be electrically floating, or may be electrically coupled to power supply voltages VDD or VSS.

As shown in FIG. 1, the source regions (such as source regions 228A and 228B of transistors 32A and 32B, respectively) that are on the source side of cell 20 have edges aligned to the edges of PODEs 34A and 34B. When another cell is abutted to edge 26A, since PODEs 34A and 34B form parasitic transistors with active regions 228A/228B and the active region of its abutting cell (not shown), there are channels 128A and 128B (referred to as PODE channels hereinafter) overlapped by PODEs 34A and 34B. PODE channels 128A and source region 228A may be the portions of the same continuous active region 28A, and PODE channels 128B and source region 228B may be the portions of the same continuous active region 28B. Source regions 228A and 228B are hence separated from edge 26A by PODE channels 128A and 128B, respectively. Alternatively, when no PODEs 34 are formed, source regions 228A and 228B extend all the way to edge 26A. Throughout the description, when a source region is referred to as being "adjacent to" an edge, it means that the source region either extends to the edge, or is joined to a channel overlapped by a PODE that extends to the edge.

Figure 2A:
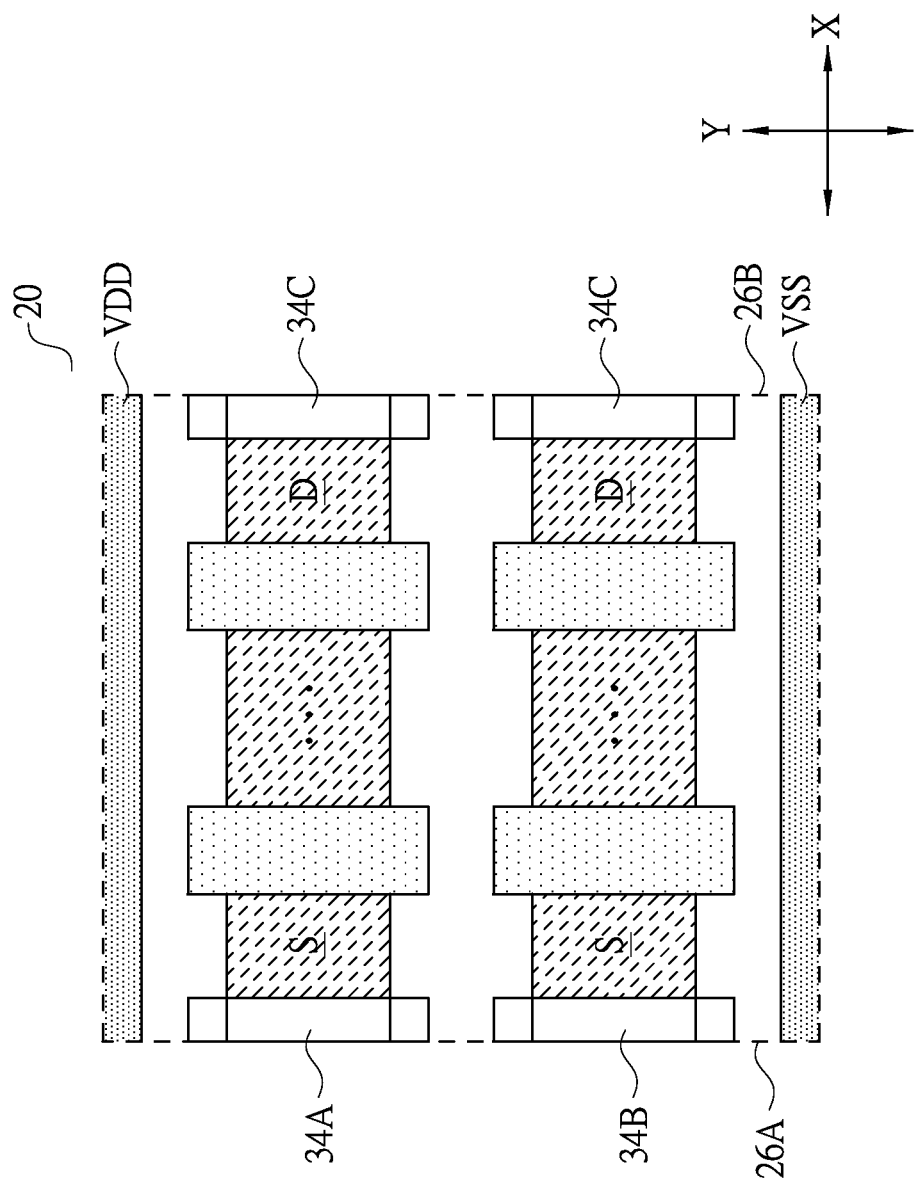
FIGS. 2A through 2E illustrate layouts of exemplary standard cells in accordance with various alternative embodiments.
Figure 2B:
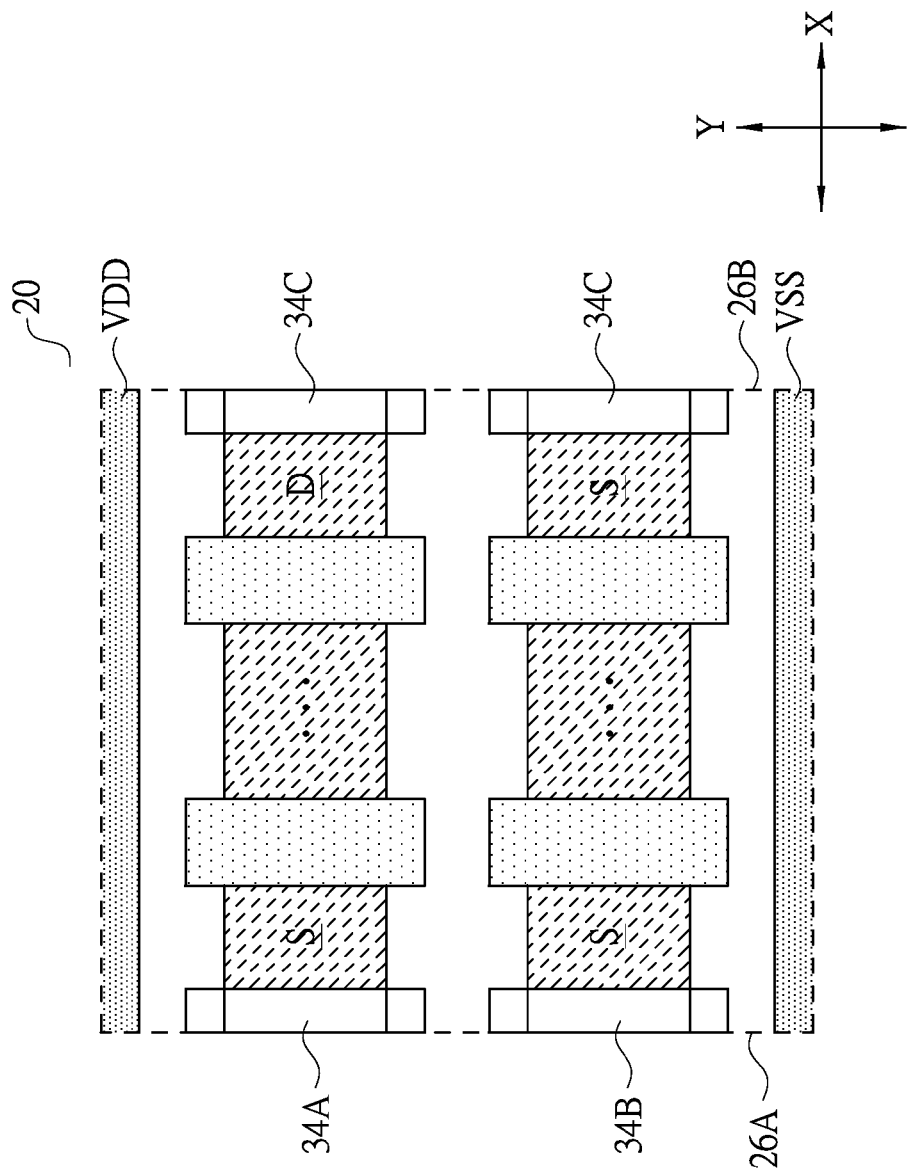

FIGS. 2A through 2E Illustrate some exemplary standard cells 20, wherein edge 26A in each of the embodiments is a source edge. In FIG. 2A, source regions "S" of transistors are on the source side and adjacent to source edge 26A. On the side adjacent to edge 26B, there are drain regions "D" of transistors. Hence, the side adjacent to edge 26B is a drain side of cell 20. In FIG. 2B, the source regions "S" are on the source side and adjacent to source edge 26A. On the side adjacent to edge 26B, there is one source region "S" and one drain region "D." Edge 26B is hence a drain edge. Although FIG. 2B illustrates that the illustrated drain region "D" may belong to a PMOS transistor (since it is closer to VDD than to VSS), and the illustrated source region "S" may belong to an NMOS transistor, in other embodiments, the illustrated source region "S" may belong to the PMOS transistor, and the illustrated drain region "D" may belong to the NMOS transistor.

Figure 2C:
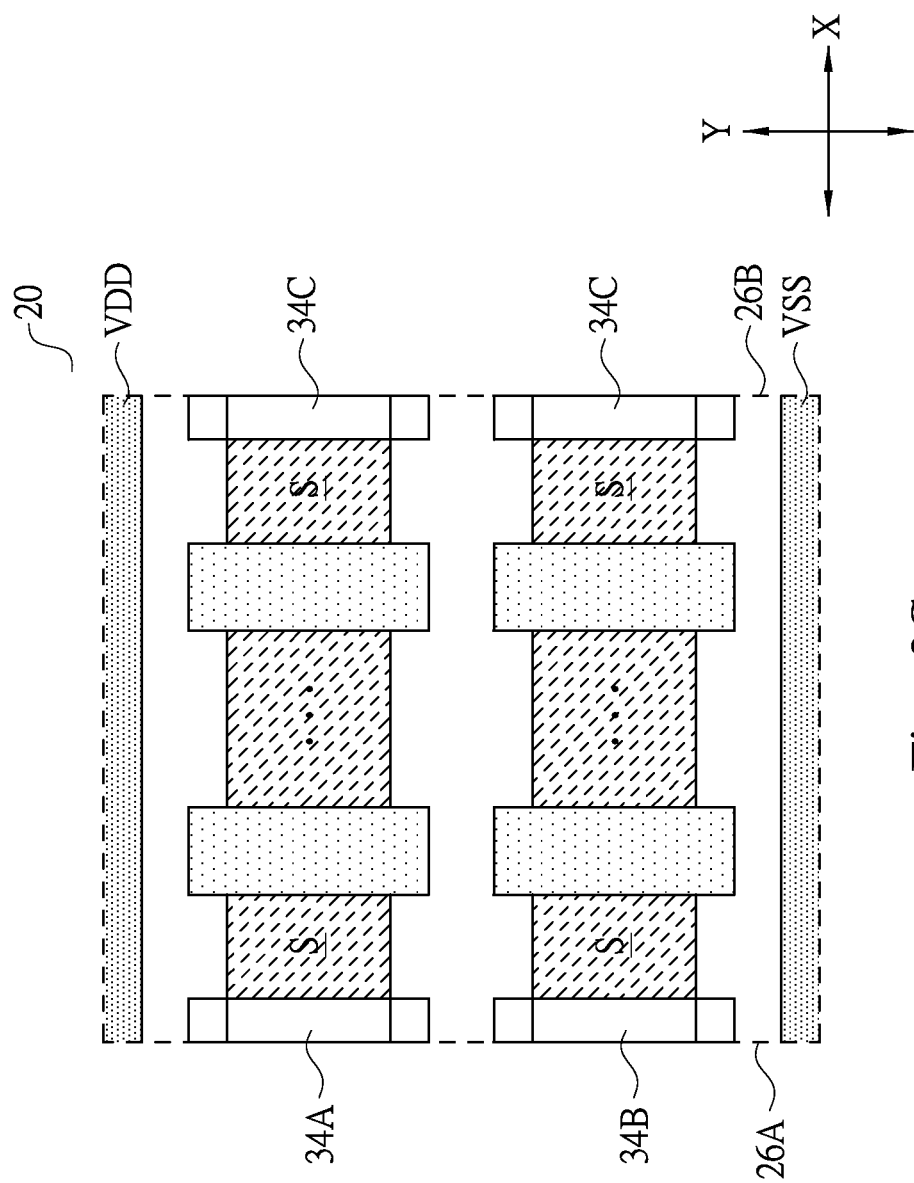
Figure 2D:
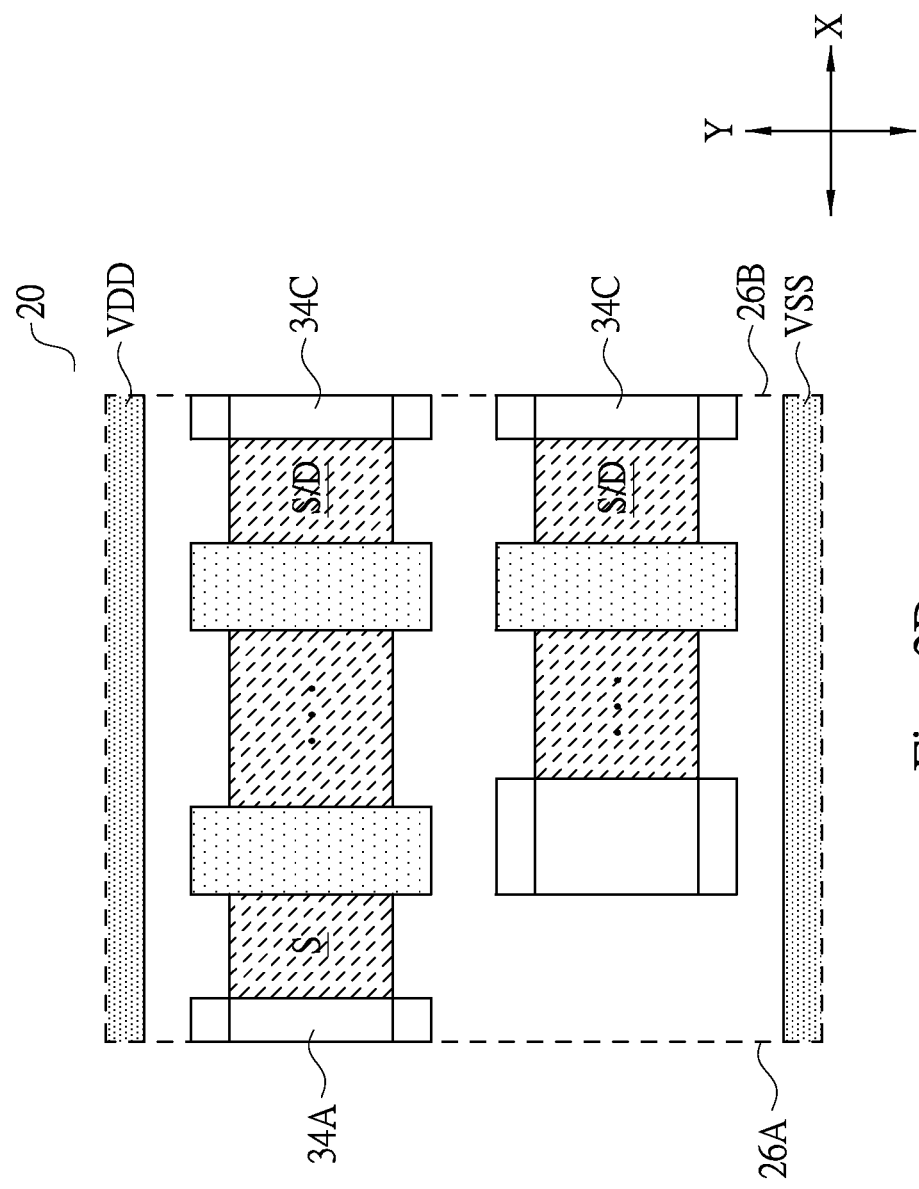
Figure 2E:
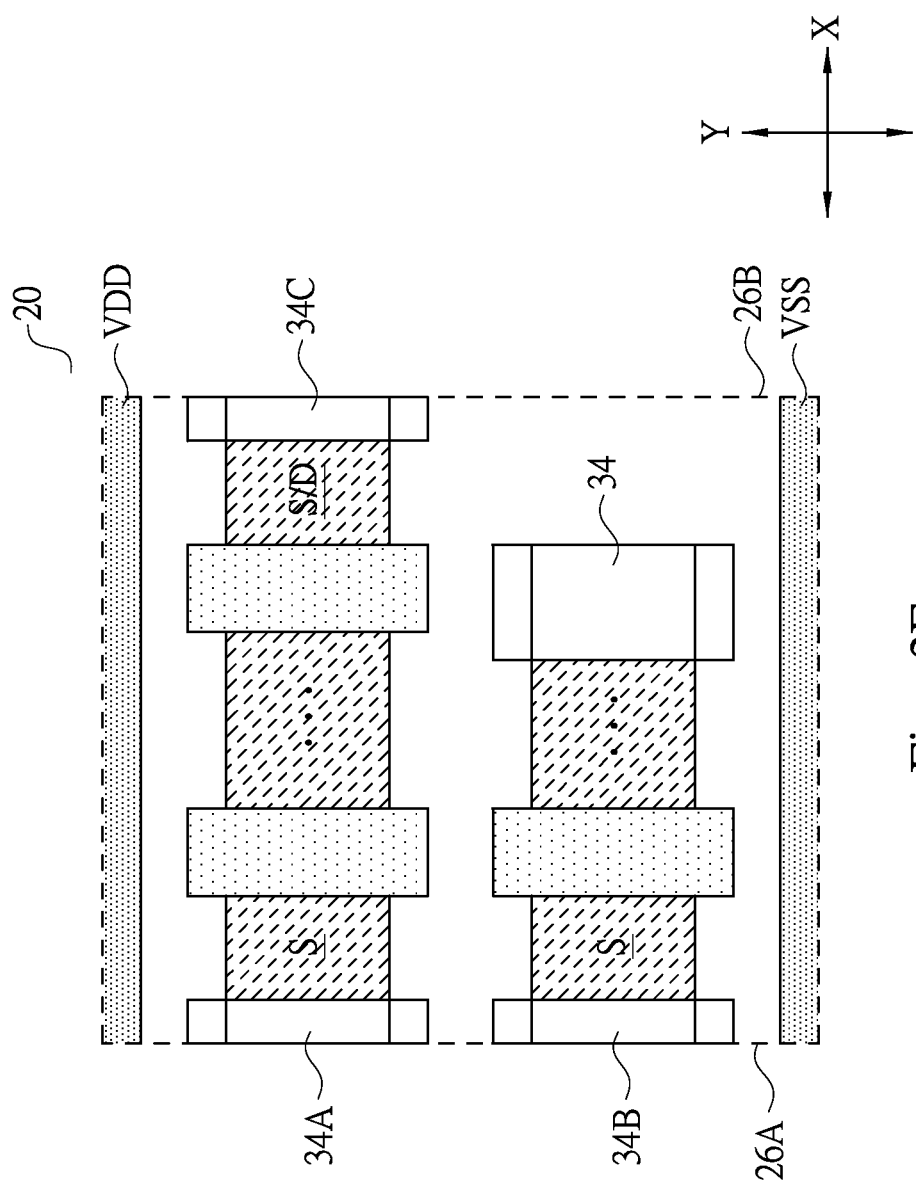

In FIG. 2C, the source regions "S" are on the source side and adjacent to source edge 26A. On the side adjacent to edge 26B, there are also source regions "S" of transistors. Hence, the side adjacent to edge 26B is another source side of cell 20, and edge 26B is also a source edge. In FIG. 2D, only one source region "S" is on the source side, and edge 26A is a source edge. In FIG. 2D, the side of edge 26B may be a drain side or a source side, depending on whether the adjacent regions are source regions or drain regions. In FIG. 2E, only one region "S/D" is on the drain side. Also, in FIG. 2E, the side of edge 26B may be a drain side or a source side, depending on whether region "S/D" is a source region or a drain region.

In accordance with some embodiments, a standard library, which may be embodied on tangible storage medium 12 in FIG. 6, may include a plurality of standard cells including what are illustrated in FIGS. 1 through 2E. Each of the standard cells includes a source side, as discussed above. Furthermore, throughout all cells in the circuit library, one side (such as the illustrated left side or right side) is designed to be the source side, and the respective edge is the source edge. For example, in the illustrated standard cells 20 in FIGS. 1 through 2E, which cells 20 are parts of the circuit library, the left side is designed and laid out to be the source side. In these examples, the right side of the standard cells in the circuit library may be a source side or a drain side, depending on the design of the individual standard cells. Furthermore, the PODEs (such as PODEs 34A in FIGS. 1 through 2E) that are on the source side of standard cells 20 and adjoining the source regions of PMOS transistors may be tied to (applied with) power supply voltage VDD or may be electrically floating. The PODEs (such as PODEs 34B in FIGS. 1 through 2E) that are on the source side of standard cells 20 and adjoining the source regions of NMOS transistors may be tied to (applied with) power supply voltage VSS (which may be electrical ground) or may be electrically floating. During the design of integrated circuits, enforcing such design rules has the advantageous features of saving chip area.

FIG. 3 illustrates integrated circuit die 100, which includes a plurality of rows extending in the X direction. In accordance with the embodiments of the present application, die 100 may be a physical die formed on a semiconductor substrate. The structure in die 100 also represents a design of a die represent that is embodied on a tangible storage medium such as hard drive 12 (FIG. 6). In the illustrated circuit, each of the rows includes a plurality of cells 20 (including 20-1 through 20-10) abutted in the X direction to form the row. The plurality of rows is also abutted in the Y direction, with the VDD lines in the neighboring rows joined together, and the VSS lines in the neighboring rows joined together. For example, the VSS line of the first row is joined with the VSS line of the second row, and the VDD line of the second row is further joined with the VDD line of the third row, and so on. Accordingly, the standard cells in the plurality of rows are interconnected physically to form an integrated circuit block, wherein all cells in the block are either physically connected to each other, or connected through other cells. Each row may include, for example, over five hundred cells or over one thousand cells. The rows may include logic circuits such as inverters, full adders, flip-flops, or the like.

Each of the cells 20 is denoted with a sequence number, and the source side edges 26A of the respective cells 20 are also marked with the sequence number. In some embodiments, the design rules allow source-to-source abutting and source-to-drain abutting, which means that the source edge of one cell is allowed to abut the source edge or drain edge of another cell. The drain-to-drain abutting, which means the abutting of the drain edge of one cell to the drain edge of another cell, however, is not allowed. In accordance with the embodiments of the present disclosure, since each of all cells in the circuit library has at least one source edge, and the source edges are on the same side, for example, the left side, it is guaranteed that the right edge of each of cell is abutted to a source edge of the cell on its right. Accordingly, regardless of whether the right edge of a cell is a source edge or a drain edge, the abutting is always allowed by design rules. Hence, no filler cell needs to be inserted into the rows in accordance with some embodiments, wherein the filler cells have the function of separating standard cells.

In the embodiments wherein the source-to-drain abutting is allowed, the PODEs 34A whose underlying PODE channels join the source regions of PMOS transistors are connected to power supply voltage VDD, and the PODEs 34B that whose underlying PODE channels join the source regions of NMOS transistors are connected to power supply voltage VSS. Since each of PODEs 34A may be merged with the PODE 34C of the cell on its left, PODEs 34C may also be tied to VDD or VSS, depending on whether the respective transistor is a PMOS transistor or an NMOS transistor, respectively. With each of the cells having a source edge, and the respective source edge of all cells on the same side (left or right side), and with PODEs 34 tied to VDD or VSS, the designer may abut an entire row of cells without the need of inserting filler cells in the row.

In accordance with some embodiments, across the entire die 100, each of all standard cells has one source side, and the source sides of all standard cells in die 100 are on the same side. In alternative embodiments, all standard cells in each row have one source side for each cell, and the source sides of all standard cells in the same row are on the same side. The standard cells in different rows, however, may have their source sides on the different sides. For example, As shown in FIG. 4, in a first row (the upper row), all standard cells have one source side for each cell, and the source sides of all standard cells in the upper row are on the left side (facing the −X direction), while in the second row (the lower row), the source sides of all standard cells in the second row are on the right side (facing the X direction). This design, however, requires two sets of standard cells in the circuit library, with one set being the flipped version of the other set.

FIG. 5 illustrates die 100 in accordance with alternative embodiments. In these embodiments, source-to-source abutting is allowed, and source-to-drain and drain-to-drain abutting are not allowed. In these embodiments, PODEs 34 may be electrically floating, although they may be tied to VDD or VSS similar to the voltage application scheme in FIGS. 3 and 4. Filler cells 120 may need to be inserted to separate the source edges of cells from the drain edges of other cells, and to separate the drain edges of cells from the drain edges of other cells, if any.

In the embodiments of the present disclosure, all standard cells are designed to have at least one source side, with no drain regions of transistors on the source side. In addition, the source side PODEs of PMOS transistors may be connected to power supply voltage VDD, and the source side PODEs of NMOS transistors may be connected to power supply voltage VSS. Through the enforcement of such design rules, the abutting of standard cells have less restriction, and fewer filler cells (or sometimes no filler cells) are needed.

In accordance with some embodiments, a die includes a plurality of rows of standard cells. Each of all standard cells in the plurality of rows of standard cells includes a transistor and a source edge, wherein a source region of the transistor is adjacent to the source edge. No drain region of any transistor in the each of all standard cells is adjacent to the source region.

In accordance with other embodiments, a die includes a plurality of rows of standard cells. Each of substantially all standard cells in the die includes a transistor including a source region and a source edge, with the source region adjacent to the source edge. Substantially all source edges of the substantially all standard cells in the die face a same direction.

In accordance with yet other embodiments, a die includes a plurality of cells forming a plurality of rows that are abutted together to form an integrated circuit block, wherein all source edges of all of the plurality of cells that are in a same row face a same direction. A plurality of VDD lines and a plurality of VSS lines extend in the same direction, wherein the plurality of VDD lines and the plurality of VSS lines are shared by the plurality of rows of standard cells. An active region is located in each of the plurality of standard cells, wherein the active region comprises a first portion and a second portion adjoining the first portion. A transistor is in the each of the plurality of standard cells, wherein the first portion of the active region forms a source region of the transistor. A dummy gate is in the each of the plurality of standard cells and overlapping the second portion of the active region, wherein the dummy gate comprises an edge aligned to a source edge of the each of the plurality of standard cells.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A die comprising:
 a plurality of rows of standard cells, wherein each of all standard cells in the plurality of rows of standard cells comprises:
  a transistor;
  a first source edge, wherein a source region of the transistor is adjacent to the first source edge, and wherein no drain region of any transistor in the each of all standard cells is adjacent to the source region; and
  a dummy gate aligned to the first source edge, wherein the dummy gate has an edge aligned to an edge of a source region of the transistor, wherein the transistor is a PMOS transistor, and the dummy gate is connected to power supply voltage VDD.

2. The die of claim 1, wherein the plurality of rows of standard cells comprises all rows of standard cells in an integrated circuit block, wherein all standard cells in the integrated circuit block are either physically abutted to each other, or connected through other ones of the standard cells that are physically abutted.

3. The die of claim 1, wherein the plurality of rows of standard cells comprises all rows of standard cells in the die.

4. The die of claim 1, wherein each of all standard cells in the plurality of rows of standard cells further comprises:
an additional dummy gate aligned to the first source edge, wherein the additional dummy gate has an edge aligned to the edge of a source region of an additional transistor, wherein the additional transistor is an NMOS transistor, and wherein the additional dummy gate is connected to power supply voltage VSS.

5. The die of claim 1, wherein each of all standard cells in the plurality of rows of standard cells further comprises:
an additional dummy gate aligned to the first source edge, wherein the additional dummy gate has an edge aligned to an edge of a source region of an additional transistor, and wherein the additional dummy gate is electrically floating.

6. The die of claim 1, wherein substantially no filler cell is inserted in any of the plurality of rows.

7. A die comprising:
a plurality of rows of standard cells, wherein each of substantially all standard cells in the die comprises:
a transistor comprising a source region;
a first source edge, with the source region adjacent to the first source edge, wherein substantially all first source edges of the substantially all standard cells in the die face a same direction; and
a dummy gate comprising:
a first edge aligned to the respective first source edge; and
a second edge aligned to an edge of the source region, wherein no drain region of any transistor in the each of the substantially all standard cells in the die has an edge aligned to any dummy region that has an edge aligned to the first source edge.

8. The die of claim 7, wherein the transistor is a PMOS transistor, and wherein the dummy gate is connected to power supply voltage VDD.

9. The die of claim 7, wherein the transistor is an NMOS transistor, and wherein the dummy gate is connected to power supply voltage VSS.

10. The die of claim 7, wherein the dummy gate is electrically floating.

11. The die of claim 7, wherein the plurality of rows of standard cells is comprised in a logic circuit.

12. The die of claim 7, wherein each of the plurality of rows of standard cells comprises at least 500 standard cells.

13. A die comprising:
a plurality of standard cells forming a plurality of rows that are abutted together to form an integrated circuit block, wherein all source edges of all of the plurality of standard cells that are in a same row face a same direction;
a plurality of VDD lines and a plurality of VSS lines extending in the same direction, wherein the plurality of VDD lines and the plurality of VSS lines are shared by the plurality of rows of the standard cells;
an active region in each of the plurality of standard cells, wherein the active region comprises a first portion and a second portion adjoining the first portion;
a transistor in the each of the plurality of standard cells, wherein the first portion of the active region forms a source region of the transistor; and
a dummy gate in the each of the plurality of standard cells and overlapping the second portion of the active region, wherein the dummy gate comprises an edge aligned to a source edge of the each of the plurality of standard cells.

14. The die of claim 13, wherein the plurality of standard cells form a logic circuit.

15. The die of claim 13, wherein all source edges of all of the plurality of standard cells in the integrated circuit block face the same direction.

16. The die of claim 13, wherein the dummy gate in each of the plurality of standard cells is connected to one of a power supply voltage VDD and power supply voltage VSS.

17. The die of claim 13, wherein the dummy gate in each of the plurality of standard cells is electrically floating.

18. The die of claim 13, wherein each of the plurality of rows comprises more than 500 cells.

* * * * *